US010686486B1

(12) United States Patent
Kanawati et al.

(10) Patent No.: US 10,686,486 B1
(45) Date of Patent: Jun. 16, 2020

(54) RADIO FREQUENCY (RF) SWITCH WITH IMPROVED POWER HANDLING

(71) Applicant: Newport Fab, LLC, Newport Beach, CA (US)

(72) Inventors: Roda Kanawati, Irvine, CA (US); Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/460,079

(22) Filed: Jul. 2, 2019

(51) Int. Cl.
| | |
|---|---|
| *H04B 1/40* | (2015.01) |
| *H04B 1/44* | (2006.01) |
| *H04B 1/04* | (2006.01) |
| *H04B 1/18* | (2006.01) |
| *H01L 21/768* | (2006.01) |
| *H01L 29/786* | (2006.01) |
| *H03F 3/189* | (2006.01) |
| *H01L 29/78* | (2006.01) |

(52) U.S. Cl.
CPC .......... *H04B 1/44* (2013.01); *H01L 21/7682* (2013.01); *H01L 29/7833* (2013.01); *H01L 29/78618* (2013.01); *H03F 3/189* (2013.01); *H04B 1/0458* (2013.01); *H04B 1/18* (2013.01); *H03F 2200/294* (2013.01); *H03F 2200/451* (2013.01)

(58) Field of Classification Search
CPC .......... H04B 1/44; H04B 1/0458; H04B 1/18; H04B 1/006; H04B 1/40; H01L 29/78618; H01L 21/7682; H01L 29/7833; H03F 3/189; H03F 2200/451; H03F 2200/294
See application file for complete search history.

(56) References Cited

U.S. PATENT DOCUMENTS

| | | | | |
|---|---|---|---|---|
| 2006/0289927 | A1* | 12/2006 | Forbes | H01L 29/4234 257/324 |
| 2007/0069285 | A1* | 3/2007 | Takami | H01L 21/28194 257/327 |
| 2007/0158702 | A1* | 7/2007 | Doczy | H01L 29/4908 257/288 |
| 2010/0327372 | A1* | 12/2010 | Goto | H01L 21/823864 257/392 |
| 2014/0054713 | A1* | 2/2014 | Lee | H01L 27/088 257/368 |
| 2015/0069514 | A1* | 3/2015 | Shih | H01L 29/42384 257/350 |
| 2015/0287942 | A1* | 10/2015 | Cao | H01L 51/0541 257/347 |
| 2019/0067276 | A1* | 2/2019 | Tsai | H01L 21/823481 |
| 2019/0148236 | A1* | 5/2019 | Chang | H01L 21/823431 |

* cited by examiner

*Primary Examiner* — Andrew Wendell
(74) *Attorney, Agent, or Firm* — Farjami & Farjami LLP

(57) ABSTRACT

A radio frequency (RF) transistor includes a drain, a source, and a gate. A first dielectric having a first dielectric constant is over the source and the drain. A gap is in the first dielectric and over the gate, the gap extending to the gate. A second dielectric is situated in the gap. The second dielectric has a second dielectric constant substantially less than the first dielectric constant so as to reduce a $C_{OFF}$ of the RF transistor. The RF transistor can be part of a stack of RF transistors in an RF switch. The RF switch can be situated between an antenna and an amplifier.

20 Claims, 12 Drawing Sheets

RADIO FREQUENCY (RF) SWITCH WITH IMPROVED POWER HANDLING

BACKGROUND

Radio frequency (RF) switches are commonly utilized in wireless communication devices (e.g., smart phones) to route signals through transmit and receive paths, for example between the device's processing circuitry and the device's antenna. RF transistors, such as field effect transistor (FET) type RF transistors, can be arranged in a stack in order to improve RF power handling of RF switches.

However, conductive materials and dielectric materials used in RF transistors often contribute to parasitic capacitances associated with RF frequencies. Particularly when RF transistors are in OFF states, these parasitic capacitances can result in significant performance tradeoffs. Further, different power handling requirements may be required for different RF transistors in a stack of transistors in an RF switch, depending on where in the stack a particular RF transistor is positioned. For example, in a wireless transceiver where a stack of RF transistors is situated between an antenna and a power amplifier (PA), or between an antenna and a low noise amplifier (LNA), power handling requirements can depend on the positions of different RF transistors relative to the antenna, the PA, and/or the LNA. Fabricating RF transistors without significant RF performance tradeoffs becomes difficult and complex.

Thus, there is a need in the art for RF transistors with reduced OFF-state capacitances that accommodate different power handling requirements in an RF switch.

SUMMARY

The present disclosure is directed to a radio frequency (RF) switch with improved power handling, substantially as shown in and/or described in connection with at least one of the figures, and as set forth in the claims.

DETAILED DESCRIPTION

Figure 1:
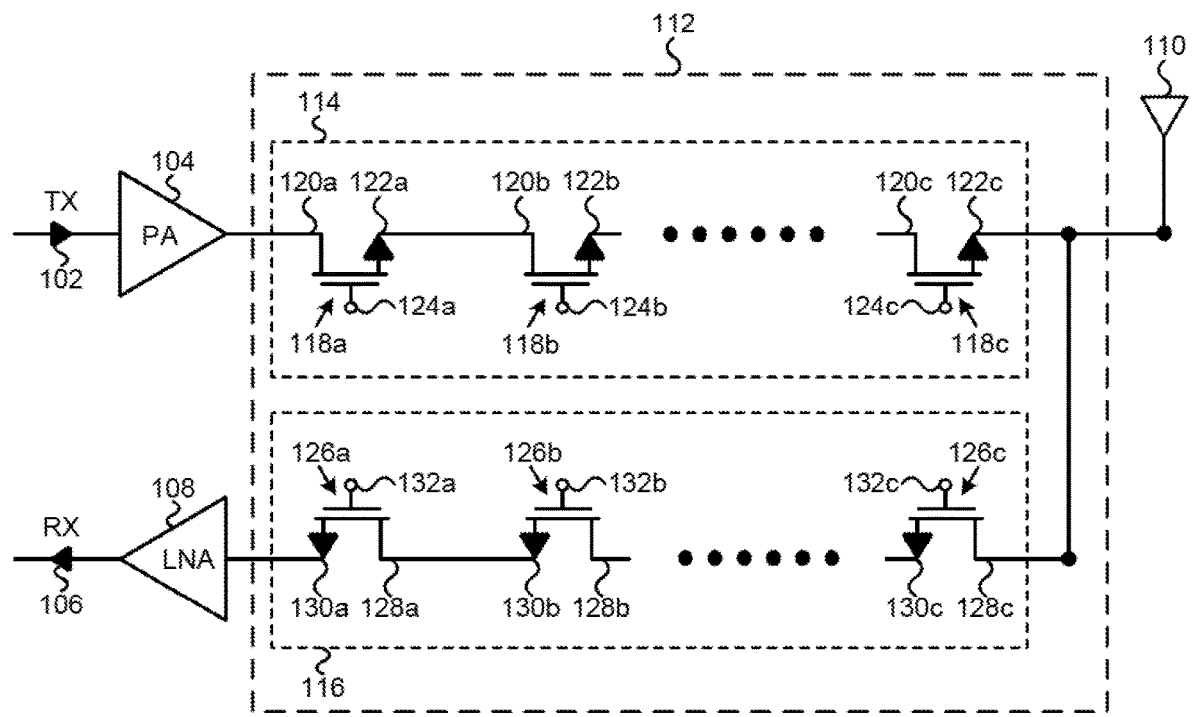
FIG. 1 illustrates a portion of a transceiver including a radio frequency (RF) switch employing stacked RF transistors according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions. Further, in the present application the terms "connected" to/with or "coupled" to/with may be used interchangeably to have the same or similar meaning, and each term may mean direct or indirect connection.

FIG. 1 illustrates a portion of a transceiver including a radio frequency (RF) switch employing stacked RF transistors according to one implementation of the present application. The transceiver in FIG. 1 includes transmit input 102, power amplifier (PA) 104, receive output 106, low-noise amplifier (LNA) 108, antenna 110, and radio frequency (RF) switch 112.

RF switch 112 is situated between PA 104 and antenna 110. PA 104 amplifies RF signals transmitted from transmit input 102. In one implementation, transmit input 102 can be coupled to a mixer (not shown in FIG. 1), or to another input source. The output of PA 104 is coupled to one end of stack 114 of RF switch 112. A matching network (not shown in FIG. 1) can be coupled between PA 104 and stack 114 of RF switch 112. Another end of stack 114 of RF switch 112 is coupled to antenna 110. Antenna 110 can transmit amplified RF signals. In one implementation, RF switch 112 can be coupled to an antenna array, rather than a single antenna 110.

RF switch 112 is also situated between LNA 108 and antenna 110. Antenna 110 also receives RF signals. Antenna 110 is coupled to one end of stack 116 of RF switch 112. Another end of stack 116 of RF switch 112 is coupled to the input of LNA 108. LNA 108 amplifies RF signals received from stack 116 of RF switch 112. A matching network (not shown in FIG. 1) can be coupled between RF switch 112 and LNA 108. Receive output 106 receives amplified RF signals from LNA 108. In one implementation, receive output 106 can be coupled to a mixer (not shown in FIG. 1), or to another output source.

RF switch 112 includes two stacks 114 and 116 of RF transistors. Stack 114 includes RF transistors 118a, 118b, and 118c. Drain 120a of RF transistor 118a is coupled to the output of PA 104. Source 122a of RF transistor 118a is coupled to drain 120b of RF transistor 118b. Source 122b of RF transistor 118b can be coupled to the drain of additional RF transistors, and ultimately coupled to drain 120c of RF transistor 118c. Source 122c of RF transistor 118c is coupled to antenna 110. Gates 124a, 124b, and 124c of RF transistors 118a, 118b, and 118c respectively can be coupled to a controller or a pulse generator (not shown) for switching RF transistors 118a, 118b, and 118c between ON and OFF states.

Stack 116 includes RF transistors 126a, 126b, and 126c. Source 130a of RF transistor 126a is coupled to the input of LNA 108. Drain 128a of RF transistor 126a is coupled to source 130b of RF transistor 126b. Drain 128b of RF transistor 126b can be coupled to the drain of additional RF transistors, and ultimately coupled to drain source 130c of RF transistor 126c. Drain 128c of RF transistor 126c is coupled to antenna 110. Gates 132a, 132b, and 132c of RF transistors 126a. 126b, and 268c respectively can be coupled to a controller or a pulse generator (not shown) for switching RF transistors 126a, 126b, and 126c between ON and OFF states.

In the example of FIG. 1, RF switch 112 switches the transceiver in FIG. 1 between receive and transmit modes. When RF transistors 118a, 118b, and 118c in stack 114 are in OFF states, and RF transistors 126a, 126b, and 126c in stack 116 are in ON states, the transceiver is in receive mode. Stack 116 serves as a receive path for RF signals received by antenna 110 to pass to LNA 108 and to receive output 106. When RF transistors 118a, 118b, and 118c in stack 114 are in ON states, and RF transistors 126a, 126b, and 126c in stack 116 are in OFF states, the transceiver is in transmit mode. Stack 114 serves as a transmit path for RF signals transmitted from transmit input 102 and PA 104 to pass to antenna 110. In various implementations, RF switch 112 can include more stacks of RF transistors and/or amplifiers. In various implementations, RF switch 112 can switch the transceiver between two transmit modes corresponding to different frequencies, or between two receive modes corresponding to different frequencies.

In the present implementation, RF transistors 118a, 118b, 118c, 126a, 126b, and 126c are N-type field effect transistors (NFETs). In various implementations, RF transistors 118a, 118b, 118c, 126a, 126b, and 126c can be P-type FETs (PFETs), junction FETs (JFETs), or any other type of transistor. By stacking RF transistors 118a, 118b, 118c, 126a, 126b, and 126c as shown in FIG. 1, the overall OFF state power and voltage handling capability for RF switch 112 can be increased. For example, if only RF transistors 118a and 126a were used, stacks 114 and 116 may each have an OFF-state RF voltage handling capability of five volts (5 V). If eight RF transistors were used in each of stacks 114 and 116, stacks 114 and 116 may each have an OFF-state RF voltage handling capability of forty volts (40 V). In various implementations, RF switch 112 can have more or fewer stacked RF transistors than shown in FIG. 1.

Figure 2:
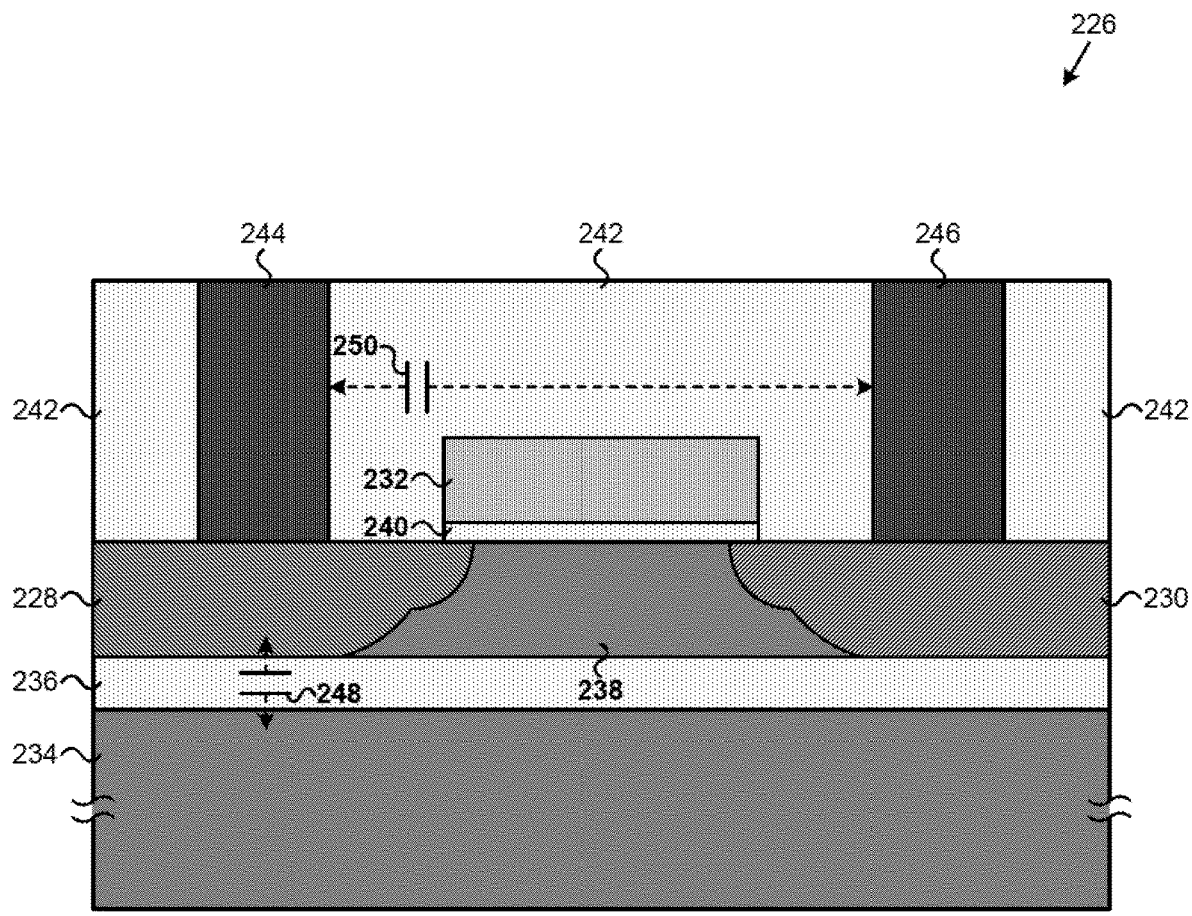
FIG. 2 illustrates a cross-sectional view of a portion of an RF transistor.

FIG. 2 illustrates a cross-sectional view of a portion of an RF transistor. RF transistor 226 includes handle wafer 234, buried oxide (BOX) 236, device layer 238, gate oxide 240, drain 228, source 230, gate 232, dielectric 242, drain contact 244, and source contact 246. RF transistor 226 in FIG. 2 generally corresponds to any of RF transistors 126a, 126b, and 126c in FIG. 1. However, it should be understood that RF transistor 226 in FIG. 2 can also generally correspond to any of RF transistors 118a, 118b, and 118c in FIG. 1.

Handle wafer 234, BOX 236, and device layer 238 can be provided together as a pre-fabricated semiconductor-on-insulator (SOI) wafer. In various implementations, a bonded and etch back SOI (BESOI) process, a separation by implantation of oxygen (SIMOX) process, or a "smart cut" process can be used for fabricating the SOI wafer as known in the art. In various implementations, handle wafer 234 can be silicon, high-resistivity silicon, germanium, or group III-V material. BOX 236 is situated on handle wafer 234. BOX 236 can be silicon dioxide or another oxide. Device layer 238 is situated on BOX 236. Device layer 238 includes drain 228 and source 230. In one implementation, RF transistor 226 is an NFET, drain 288 and source 230 are doped with an n-type dopant, and the remaining body of device layer 238 is doped with a p-type dopant. Drain 228 and/or source 230 can include lightly-doped regions near gate 232. Drain 228 and/or source 230 can also include a silicide.

Gate oxide 240 is thin oxide situated over device layer 238 and between drain 228 and source 230. In one implementation, gate oxide 240 is silicon dioxide. Gate 232 is situated over gate oxide 240. In one implementation, gate 232 is polycrystalline silicon. RF transistor 226 can include a gate contact in another plane not visible in the cross-sectional view of FIG. 2.

Dielectric 242 is situated over drain 228 and source 230. Notably, dielectric 242 is also situated over gate 232. In various implementations, dielectric 242 can comprise borophosphosilicate glass (BPSG), tetra-ethyl ortho-silicate (TEOS), silicon onynitride ($SiO_XN_Y$), silicon dioxide ($SiO_2$), silicon nitride ($Si_XN_Y$), or another dielectric. In one implementation, the dielectric constant of dielectric 242 is approximately 3.9 or greater. Drain contact 244 and source contact 246 are situated in dielectric 242. Drain contact 244 and source contact 246 extend to drain 228 and source 230 respectively. In one implementation, drain contact 244 and source contact 246 comprise tungsten (W).

Notably, various parasitic capacitors are formed in tranistor 226 when transistor 226 is in an OFF state. Parasitic capacitor 248 is formed between device layer 238 and handle wafer 234. Additionally, OFF-state capacitor 250 is formed between drain contact 244 and source contact 246. As described below, parasitic capacitor 248 provides drain 228 and source 230 an electrical path to ground, and is a cause of non-uniform voltage distribution in a stack of RF transistors, such as in stack 116 in FIG. 1.

Figure 3:
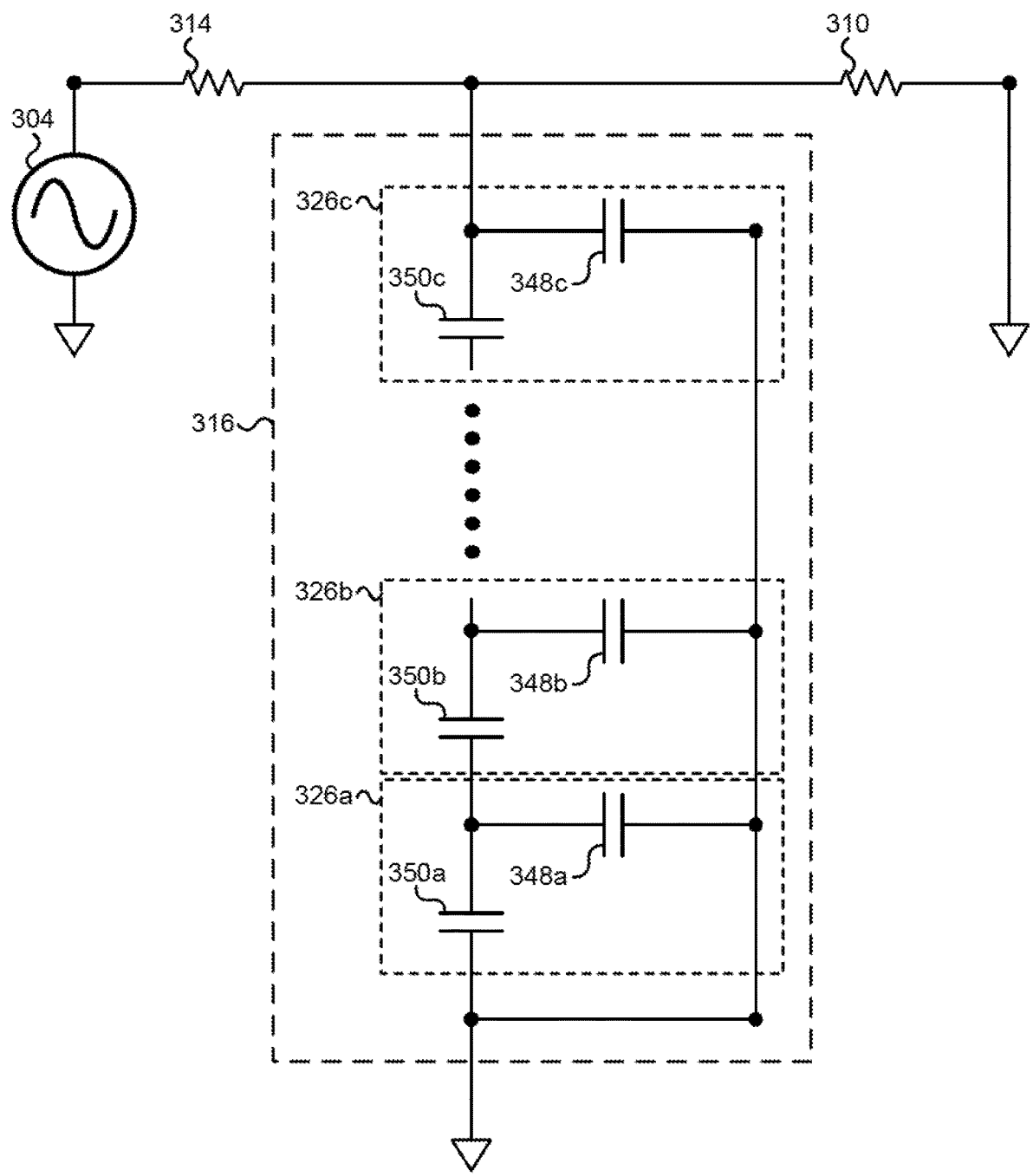
FIG. 3 illustrates a circuit model corresponding to a stack of transistors in the transceiver in FIG. 1 according to one implementation of the present application.

FIG. 3 illustrates a circuit model corresponding to a stack of transistors in the transceiver in FIG. 1 according to one implementation of the present application. The circuit model includes RF power source 304, resistors 314 and 310, and stack 316. Stack 316 includes RF transistors 326a, 326b, and 326c, respective parasitic capacitors 348a, 348b, and 348c, and respective OFF-state capacitors 350a, 350b, and 350c.

The circuit model in FIG. 3 generally represents the transceiver in FIG. 1 in a transmit mode, when stack 114 is ON and stack 116 is OFF. RF power source 304 in FIG. 3 represents the output of PA 104 in FIG. 1. Resistor 314 in FIG. 3 represents an impedance of stack 114 of RF switch 112 in FIG. 1. Resistor 310 in FIG. 3 represents an impedance of antenna 110 in FIG. 1. Parasitic capacitors 348a, 348b, and 348c in FIG. 3 represent parasitic capacitors for RF transistors 126a, 126b, and 126c respectively in FIG. 1. Parasitic capacitors 348a, 348b, and 348c in FIG. 3 correspond to parasitic capacitor 248 in FIG. 2, which exists between device layer 238 and handle wafer 234. OFF-state capacitors 350a, 350b, and 350c in FIG. 3 represent OFF-state capacitors for RF transistors 126a, 126b, and 126c respectively in FIG. 1. OFF-state capacitors 350a, 350b, and 350c in FIG. 3 correspond to OFF-state capacitor 250 in FIG. 2, which exists between drain contact 244 and source contact 246.

In an ideal version of the circuit, parasitic capacitors 348a, 348b, and 348c would not exist. RF voltage provided from RF power source 304 to resistor 310 would be uniformly distributed to OFF-state capacitors 350a, 350b, and 350c. This would represent RF transistors 126a, 126b, and 126c in stack 116 in FIG. 1 uniformly withstanding the RF voltage at antenna 110 when stack 114 is ON and stack 116 is OFF.

However, in practice. RF power provided from RF power source 304 finds a path to ground through parasitic capacitors 348a, 348b, and 348c. As described above, these paths are provided due to capacitive coupling between device layer 238 and handle wafer 234 (shown in FIG. 2). When the values of parasitic capacitors 348a, 348b, and 348c are small relative to the values of OFF-state capacitors 350a, 350b, and 350c, the RF voltage drop is iteratively less across RF transistors 326a, 326b, and 326c in stack 316. For example, the RF voltage drop across RF transistor 326b is less than the RF voltage drop across RF transistor 326c, due to parasitic capacitors 348c and 348b diverting some of the charge to be coupled across RF transistor 326b. Likewise, the RF voltage drop across RF transistor 326a is less than the RF voltage drop across RF transistor 326b, due to parasitic capacitors 348a, 348b, and 348c diverting some of the charge to be coupled across RF transistor 326a. As a consequence, when RF transistors 326a, 326b, and 326c are in their OFF states, the RF voltage across OFF-state capacitor 350a is less than the RF voltage across OFF-state capacitor 350b, and the RF voltage across OFF-state capacitor 350b is less than the RF voltage across OFF-state capacitor 350c. In other words, RF voltage is non-uniformly distributed between RF transistors 326a, 326b, and 326c in stack 316.

Although the non-uniform RF voltage distribution is described above in the context of stack 316 in an OFF state, it is understood that any stack in an OFF state in RF switch 112 (shown in FIG. 1) can experience non-uniform RF voltage distribution. In one implementation, the circuit model in FIG. 3 can represent the transceiver in FIG. 1 in a receive mode, when stack 114 is in an OFF state and stack 116 is in an ON state.

In this implementation, RF power source 304 in FIG. 3 would represent antenna 110 in FIG. 1, resistor 314 in FIG. 3 would represent an impedance of stack 116 of RF switch 112 in FIG. 1, and parasitic capacitors 348a, 348b, and 348c in FIG. 3 would represent parasitic capacitors for RF transistors 118a, 118b, and 118c respectively in FIG. 1. RF voltage would be non-uniformly distributed between RF transistors 118a, 118b, and 118c in stack 114. The RF voltage drop across RF transistor 118b would be less than the RF voltage drop across RF transistor 118c, and the RF voltage drop across RF transistor 118a would be less than the RF voltage drop across RF transistor 118b. In this implementation where antenna 110 (rather than PA 104) functions as RF power source 304, the overall RF voltage drop may be lower since signals received at antenna 110 in receive mode are generally weaker than the amplified RF signals transmitted at PA 104 in transmit mode.

In one example, the RF voltage provided by RF power source 304 (e.g., PA 104 in FIG. 1) may be fifteen volts (15 V), the voltage drop across RF transistor 326c may be eight volts (8 V), while the voltage drop across RF transistor 326b may be five volts (5 V), and the voltage drop across RF transistor 326a may be two volts (2 V). In this example, if RF transistors 326a, 326b, and 326c were designed such that each had a drain-to-source breakdown voltage ($V_{BR}$) of five volts (5 V), the eight volts (8 V) voltage drop across RF transistor 326c would exceed its voltage handling capability, and stack 316 would experience failure.

In one solution, RF transistors 326a, 326b, and 326c are designed such that each has a breakdown voltage equal to or greater than the highest voltage drop across each respective transistor. Continuing with the above example, RF transistors 326a, 326b, and 326c can be designed such that each has a breakdown voltage of eight volts (8 V). However, this results in RF transistors 326b and 326a having breakdown voltages greater than the voltage drops those transistors will experience during operation. That is, the eight volts (8 V) breakdown voltages would be greater than the five volts (5 V) and two volts (2 V) voltage drops across RF transistors 326b and 326a. Because increased breakdown voltage trades off RF performance, it is disadvantageous to over-design RF transistors 326b and 326a such that their breakdown voltages are greater than their respective voltage drops. As described below, according to one solution in the present application, the non-uniform RF voltage distribution otherwise caused by parasitic capacitors 348a, 348b, and 348c can be overcome.

Figure 4A:
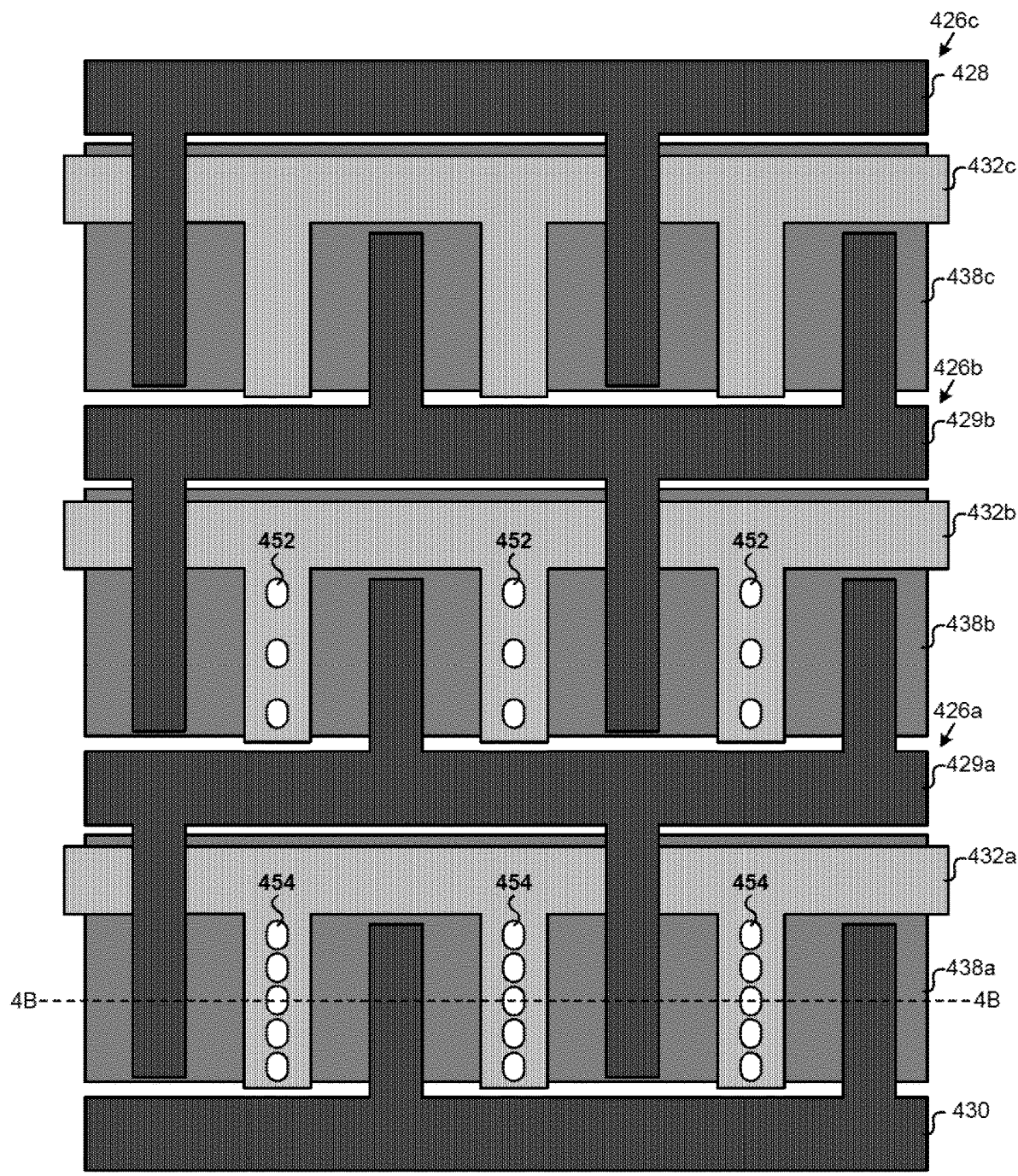
FIG. 4A illustrates a top view of a portion of a stack of RF transistors according to one implementation of the present application.

FIG. 4A illustrates a top view of a portion of a stack of RF transistors according to one implementation of the present application. The stack includes lower-$C_{OFF}$ transistor 426a, higher-$C_{OFF}$ transistor 426b, and reference transistor 426c having highest $C_{OFF}$ (thus, reference transistor 426c can also be referred to as highest-$C_{OFF}$ transistor 426c). Lower-$C_{OFF}$ transistor 426a includes shared drain/source contact 429a, source contact 430, gate 432a, device layer 438a, and gaps 454. Higher-$C_{OFF}$ transistor 426b includes shared drain/source contact 429b, shared drain/source contact 429a, gate 432b, device layer 438b, and gaps 452. Reference transistor 426c includes drain contact 428, shared drain/source contact 429b, gate 432c, and device layer 438c. The stack in FIG. 4A generally corresponds to stack 116 of RF transistors 126a, 126b, and 126c in FIG. 1. However, it should be understood that the stack in FIG. 4A can also generally correspond to any stack in RF switch 112. The stack in FIG. 4A may include other features not shown, such as dielectric 242 (shown in FIG. 2).

As shown in FIG. 4A, gaps 452 are situated over gate 432b of higher-$C_{OFF}$ transistor 426b. Gaps 454 are situated over gate 432a of lower-$C_{OFF}$ transistor 426a. As described below, gaps 452 and 454 comprise low dielectric constant material. In the present implementation, gaps 452 and 454 are approximately circular. Gaps 452 have approximately the same dimensions as gaps 454. Gates 432b and 432a are interdigitated, and gaps 452 and 454 are situated over digits of gates 432b and 432a respectively. Gaps 452 and 454 are also approximately uniformly spaced over digits of gates 432b and 432a.

Notably, the number of gaps 454 is greater than the number of gaps 452. In particular, there are fifteen gaps 454 and nine gaps 452. Gaps 454 collectively implement a large gap over gate 432a in lower-$C_{OFF}$ transistor 426a. Similarly, gaps 452 collectively implement a small gap over gate 432b in higher-$C_{OFF}$ transistor 426b. The large gap comprises a large volume of low dielectric constant material over gate 432a, which reduces OFF-state capacitance ($C_{OFF}$) between shared drain/source contact 429a and source contact 430 in lower-$C_{OFF}$ transistor 426a. The small gap comprises a small volume of low dielectric constant material over gate 432b, which reduces $C_{OFF}$ between shared drain/source contact 429a and shared drain/source contact 429b in higher-$C_{OFF}$ transistor 426b. Because gaps 454 create a large volume of low dielectric constant material in lower-$C_{OFF}$ transistor 426a, lower-$C_{OFF}$ transistor 426a has lower $C_{OFF}$ compared to higher-$C_{OFF}$ transistor 426b.

Reference transistor 426c does not include any gaps. No low dielectric constant material is situated over gate 432c. $C_{OFF}$ is not reduced between drain contact 428 and shared drain/source contact 429b in reference transistor 426. Thus, reference transistor 426c is the highest-$C_{OFF}$ transistor in the example of FIG. 4A. Because gaps 452 create a small volume of low dielectric constant material in higher-$C_{OFF}$ transistor 426b, higher-$C_{OFF}$ transistor 426b has a reduced $C_{OFF}$ compared to reference transistor 426c.

In order to substantially uniformly distribute RF voltage across each RF transistor in a stack, according to the present application, the $C_{OFF}$ values in each RF transistor are designed according to the relative RF power and voltage that is expected to be distributed to each RF transistor in the stack based on the proximity of each RF transistor to the RF power source. For example, in FIG. 3 where, absent the present application, a higher RF voltage would be provided across RF transistor 326c near RF power source 304 relative to RF transistor 326a far from RF power source 304, RF transistor 326c near RF power source 304 is designed to have higher $C_{OFF}$ relative to RF transistor 326a far from RF power source 304, which are designed to have lower $C_{OFF}$.

For example, OFF-state capacitor 350c in FIG. 3 near RF power source 304 would be designed to have higher $C_{OFF}$ value than both OFF-state capacitors 350b and 350a, while OFF-state capacitor 350b would be designed to have higher $C_{OFF}$ value than OFF-state capacitor 350a. As such, despite parasitic capacitors 348a, 348b, and 348c diverting some of the charge coupled by OFF-state capacitors 350a, 350b, and 350c in stack 316, the voltage across each of RF transistors 326a, 326b, and 326c would be substantially uniform.

Once the desired values of OFF-state capacitors 350a, 350b, and 350c are determined based on the proximities of their RF transistors 326a, 326b, and 326c from RF power source 304, the volumes of low dielectric constant material over gates of RF transistors 326a, 326b, and 326c are correspondingly designed and fabricated so as to result in the desired capacitance values for OFF-state capacitors 350a, 350b, and 350c.

In one example, as shown in FIG. 4A, no gaps are over gate 432c of reference transistor 426c, nine gaps 452 are over gate 432b of higher-$C_{OFF}$ transistor 426b, and fifteen gaps 454 are over gate 432a of lower-$C_{OFF}$ transistor 426a. Lower-$C_{OFF}$ transistor 426a, higher-$C_{OFF}$ transistor 426b, and reference transistor 426c in FIG. 4A can correspond to RF transistors 326a, 326b, and 326c in FIG. 3 respectively, such that lower-$C_{OFF}$ transistor 426a which has a large volume of low dielectric constant material over gate 432a is far from RF power source 304 in stack 316, while reference transistor 426c (i.e. the highest-$C_{OFF}$ transistor) with no low dielectric constant material over gate 432c is near RF power source 304.

Thus, according to the present application, the desired values of $C_{OF}$ for lower-$C_{OFF}$ transistor 426a, higher-$C_{OFF}$ transistor 426b, and reference transistor 426c, are determined based on the proximity to an RF power source (e.g., RF power source 304 in FIG. 3). To implement the desired values of $C_{OFF}$, the volumes of low dielectric constant material over gates 432a, 432b, and 432c are accordingly adjusted. Importantly, this solution allows each stacked RF transistor to be designed with the same or substantially the same breakdown voltage, while avoiding failures and avoiding over-designing the RF transistors by trading off their critical performance characteristics. For example, lower-$C_{OFF}$ transistor 426a, higher-$C_{OFF}$ transistor 426b, and reference transistor 426c would not be over-designed to sacrifice their RF performance. This solution is also flexible in that it can be practiced in conjunction with solutions that vary the breakdown voltages of RF transistors 426a, 426b, and 426c and/or solutions that vary parasitic capacitors 348a, 348b, and 348c (shown in FIG. 3). Further, decreasing the values of $C_{OFF}$ for transistors in the stack reduces the capacitive load on the RF power source (e.g., RF power source 304 in FIG. 3), saving battery power.

In various implementations, such as implementations involving swapping RF signals from one antenna to another, either or both ends of an RF transistor stack can encounter high voltage RF power sources. In these implementations, a lower-$C_{OFF}$ transistor can be situated approximately in the middle of the stack, while higher-$C_{OFF}$ transistors can be situated at both ends of the stack near the high voltage RF power sources.

Using reference transistor 426c simplifies processing by eliminating the need to create any gaps for one transistor in a stack. However, in various implementations, a reference transistor 426c is not used. For example, reference transistor 426c can be replaced with a higher-$C_{OFF}$ transistor comprising a gap, and higher-$C_{OFF}$ transistor 426b can be replaced with a medium-$C_{OFF}$ transistor comprising a gap with a medium volume of low dielectric material.

Using gaps 452 and 454 over digits of gates 432b and 432a allows gate contacts (not shown in FIG. 4A) to be easily aligned and formed over arms of gates 432b and 432a. However, in various implementations, gaps 452 and 454 and/or gates 432b and 432a can have different arrangements. For example, in one implementation, gaps can be situated over arms of gates 432b and 432a. In one implementation, gaps 452 and 454 are not uniformly spaced. In one implementation, RF transistors in FIG. 4A include singular gates, drains, and/or sources instead of interdigitated ones. In one implementation, gaps 452 and 454 are larger than shown in FIG. 4A, and are situated over both gates 432b and 432a and over device layers 438b and 438a.

Figure 4B:
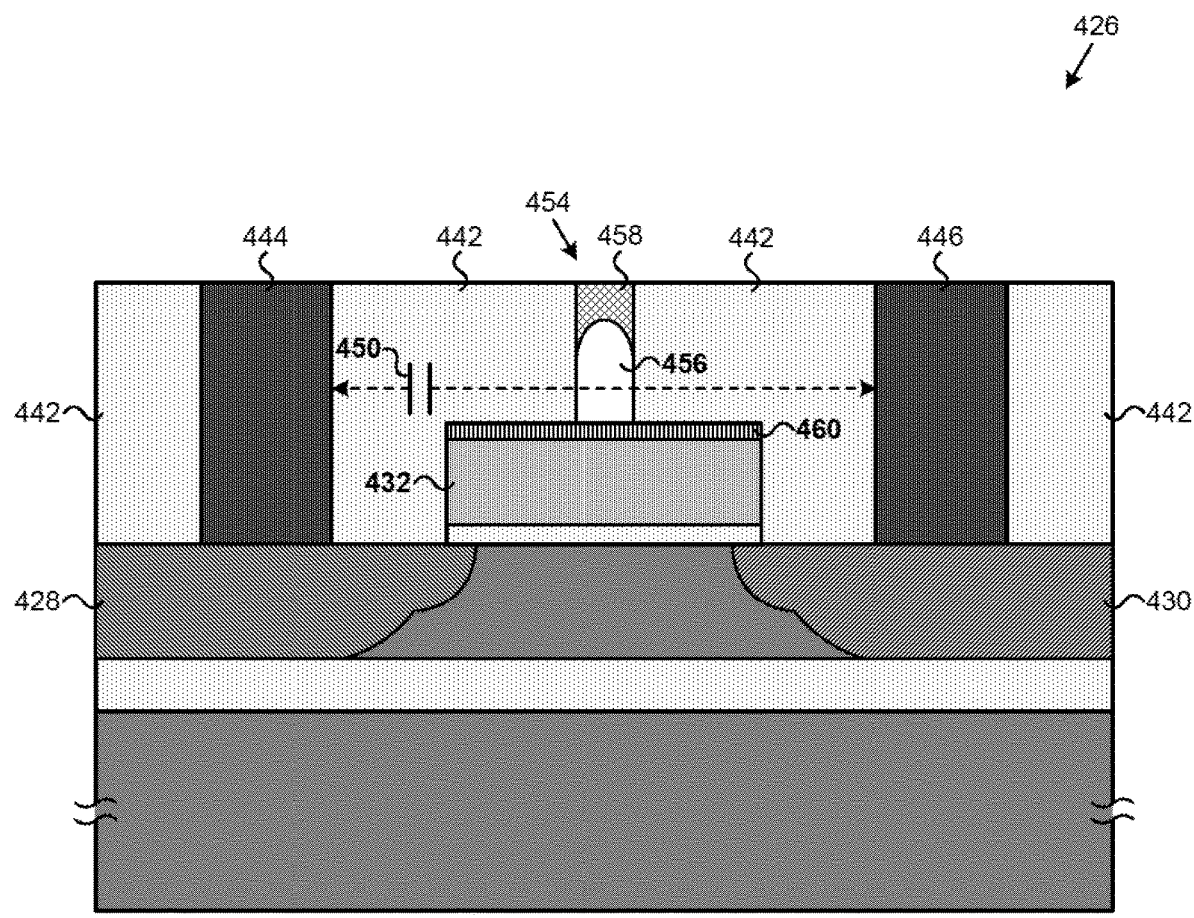
FIG. 4B illustrates a cross-sectional view of a portion of an RF transistor in FIG. 4A according to one implementation of the present application.

FIG. 4B illustrates a cross-sectional view of a portion of an RF transistor in FIG. 4A according to one implementation of the present application. FIG. 4B shows a portion of a cross-section along line 4B-4B in FIG. 4A. RF transistor 426 in FIG. 4B is similar to RF transistor 226 in FIG. 2, except that RF transistor 426 in FIG. 4B includes gap 454 and optional nitride layer 460.

While dielectric 442 is situated over drain 428 and source 430, gap 454 is situated in dielectric 442 over gate 432. In the present example, gap 454 includes air gap 456 and pinched-off region 458. In one implementation, gap 454 is etched in dielectric 442. Then, air gap 456 is formed automatically when pinched-off region 458 is formed using a pinch-off deposition. Where gap 454 has an appropriate aperture, depositing a dielectric using a non-conformal low gap-fill process, such as chemical vapor deposition (CVD), causes the dielectric to pinch-off between sidewalls near the top of gap 454, thereby resulting in air gaps 456. The deposited dielectric can then be planarized with dielectric 442, as shown in FIG. 4B, resulting in pinched-off region 458.

Optional nitride layer 460 can perform as an etch stop when gap 454 is formed to protect gate 432 from damage. Optional nitride layer 460 can also perform as an etch stop when a gate contact (not shown in FIG. 4B) is formed. In one implementation, optional nitride layer 460 comprises silicon nitride ($Si_xN_y$). Optional nitride layer 460 is considered optional in that gap 454 can be formed in RF transistor 426 without optional nitride layer 460.

Because gap 454 includes air gap 456, gap 454 reduces $C_{OFF}$ between drain contact 444 and source contact 446. In particular, air gap 456 comprises air which is a low dielectric constant material having a dielectric constant of approximately 1.0. As used in the present application, "low dielectric constant material" refers to material having a dielectric constant significantly less than dielectric 442. For example, when dielectric 442 is silicon dioxide, a low dielectric constant material can have a dielectric constant significantly less than approximately 3.9. Pinched-off region 458 can also comprise a low dielectric constant material, for example, having a dielectric constant from approximately 2.0 to approximately 3.0.

Gap 454 extends to gate 432 (and to optional nitride layer 460 where optional nitride layer 460 is used). As used in the present application, a gap "extending to" a gate can refer to a gap completely reaching the gate so that it touches the gate, or can refer to a gap extending substantially to the gate without completely reaching the gate or touching the gate. Thus, gap 454 is referred to as "extending to" gate 432, despite the presence of intervening material between gate 432 and gap 454. Such intervening material can include optional nitride layer 460 over gate 432, a silicide (not shown in FIG. 4B) over gate 432, or even a layer of dielectric 442 remaining after forming gap 454, for example, as a result of conservatively timing an etch to avoid damaging gate 432.

In RF transistor 426 in FIG. 4B, utilizing gap 454 to introduce low dielectric constant material over gate 432 effectively lowers the dielectric constant of dielectric 442, thereby reducing the OFF-state capacitance between drain contact 444 and source contact 446. For example, the value of OFF-state capacitor 450 in FIG. 4B can be significantly less compared to the value of OFF-state capacitor 250 in FIG. 2. RF transistor 426 achieves this reduced $C_{OFF}$ without using costly materials and without requiring any specialized fabrication techniques. For example, dielectric 442 can be situated over drain 428 and source 430, and drain contact 444 and source contact 446 can be formed in typical manner, while $C_{OFF}$ can be reduced. As described above, reduced $C_{OFF}$ reduces capacitive load on an RF power source, saving battery power, and further enables substantially uniformly distributing RF voltage in an RF transistor stack.

Figure 5A:
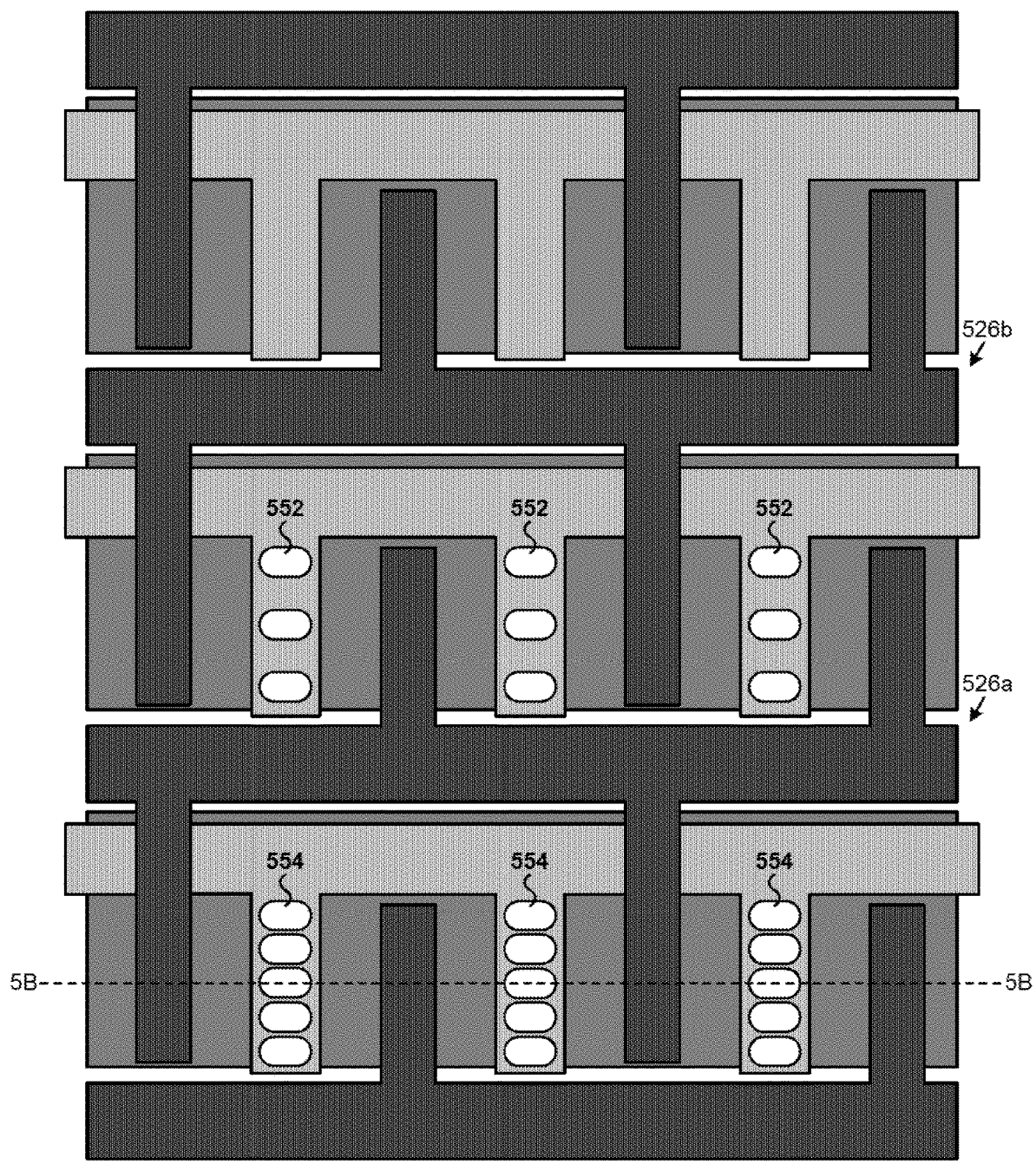
FIG. 5A illustrates a top view of a portion of a stack of RF transistors according to one implementation of the present application.

FIG. 5A illustrates a top view of a portion of a stack of RF transistors according to one implementation of the present application. The stack in FIG. 5A is similar to the stack in FIG. 4A, except that, unlike gaps 452 and 454 in FIG. 4A which are substantially circular, gaps 552 and 554 in FIG. 5A are wide gaps. In FIG. 5A, wide gaps 552 and 554 create larger volumes of low dielectric constant material compared to the volumes created by gaps 452 and 454 in FIG. 4A. Thus, higher-$C_{OFF}$ transistor 526b and lower-$C_{OFF}$ transistor 526a in FIG. 5A both have lower $C_{OFF}$ compared to higher-$C_{OFF}$ transistor 426b and lower-$C_{OFF}$ transistor 426a in FIG. 4A. Other than the differences described above, the stack in FIG. 5A may have any implementations and advantages described above.

Figure 5B:
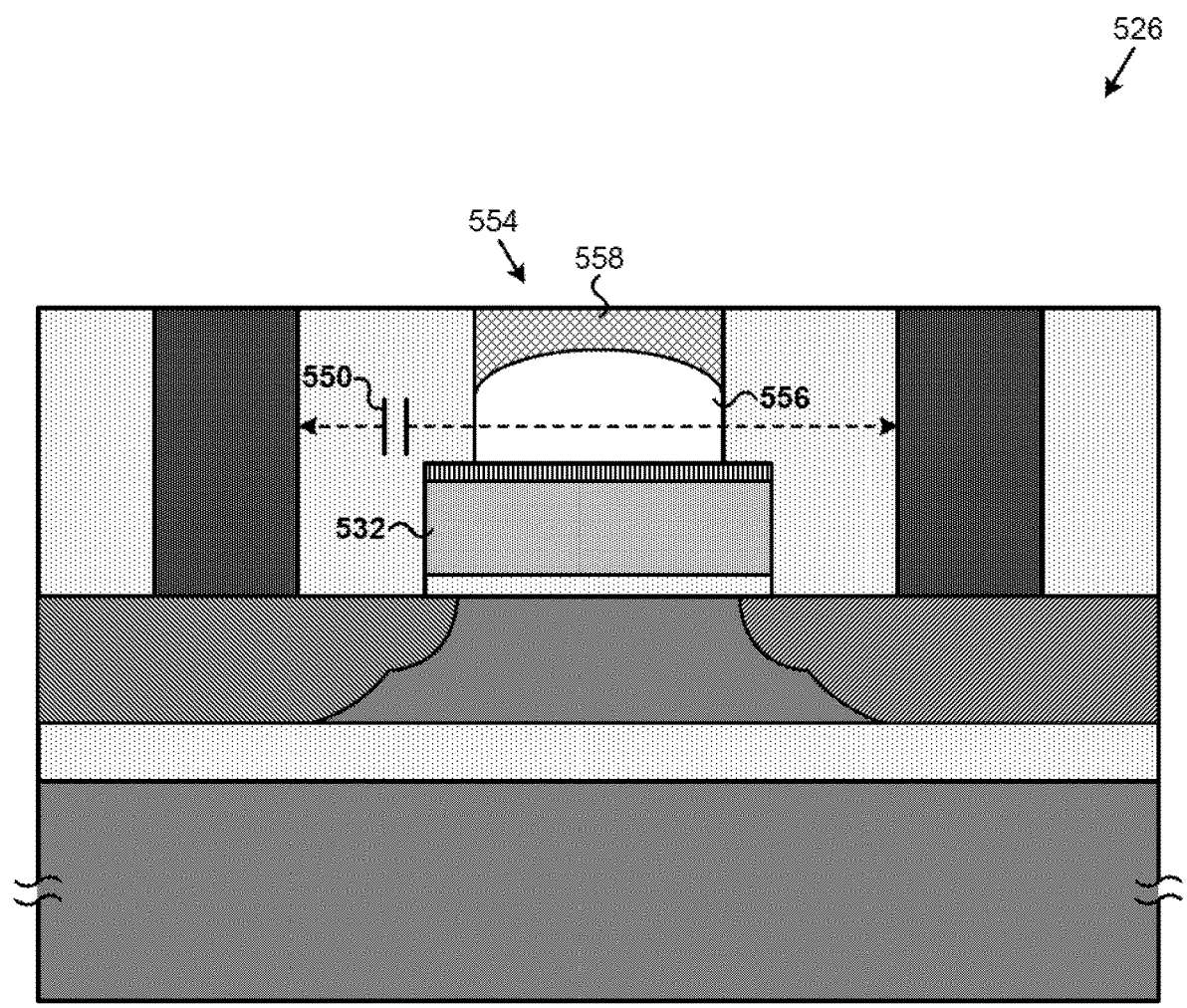
FIG. 5B illustrates a cross-sectional view of a portion of an RF transistor in FIG. 5A according to one implementation of the present application.

FIG. 5B illustrates a cross-sectional view of a portion of an RF transistor in FIG. 5A according to one implementation of the present application. FIG. 5B shows a portion of a cross-section along line 5B-5B in FIG. 5A. RF transistor 526 in FIG. 5B is similar to RF transistor 426 in FIG. 4B, except that RF transistor 526 in FIG. 5B includes wide gap 554. Wide gap 554 includes wide air gap 556 and wide pinched-off region 558. In various implementations, wide gap 554 can be wider than shown and can extend below a top surface of gate 532. In FIG. 5B, wide gap 554 creates a larger volume of low dielectric constant material compared to the volume created by gap 454 in FIG. 4B. Thus, the value of OFF-state capacitor 550 in FIG. 5B can be significantly less compared to the value of OFF-state capacitor 450 in FIG. 4B. Other than the differences described above, RF transistor 526 in FIG. 5B may have any implementations and advantages described above.

Figure 6A:
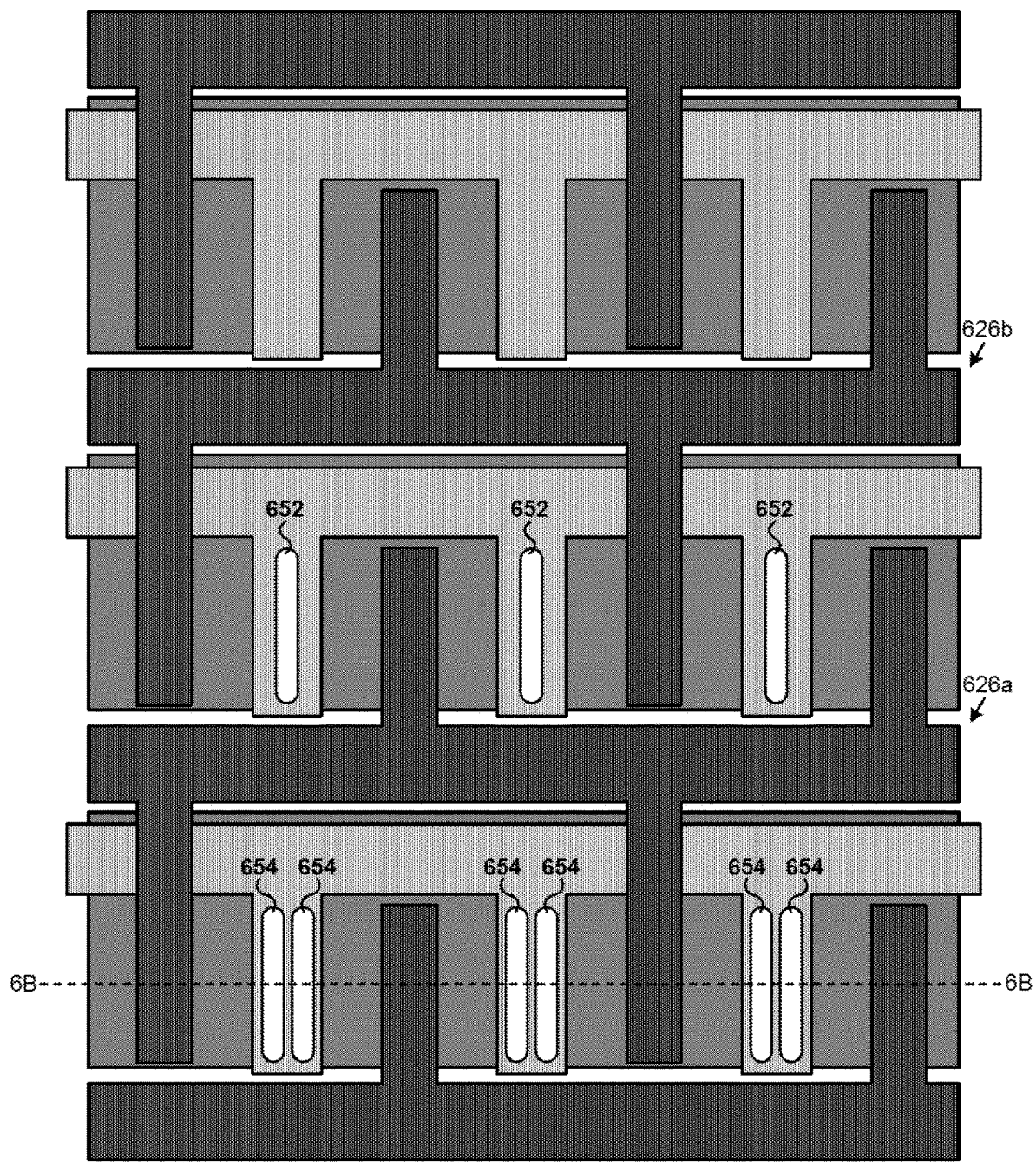
FIG. 6A illustrates a top view of a portion of a stack of RF transistors according to one implementation of the present application.

FIG. 6A illustrates a top view of a portion of a stack of RF transistors according to one implementation of the present application. The stack in FIG. 6A is similar to the stack in FIG. 4A, except that, unlike gaps 452 and 454 in FIG. 4A which are substantially circular, gaps 652 and 654 in FIG. 5A are long gaps. In FIG. 6A, long gaps 652 and 654 create larger volumes of low dielectric constant material compared to the volumes created by gaps 452 and 454 in FIG. 4A. Thus, higher-$C_{OFF}$ transistor 626b and lower-$C_{OFF}$ transistor 626a in FIG. 6A both have lower $C_{OFF}$ compared to higher-$C_{OFF}$ transistor 426b and lower-$C_{OFF}$ transistor 426a in FIG. 4A. Other than the differences described above, the stack in FIG. 6A may have any implementations and advantages described above.

Figure 6B:
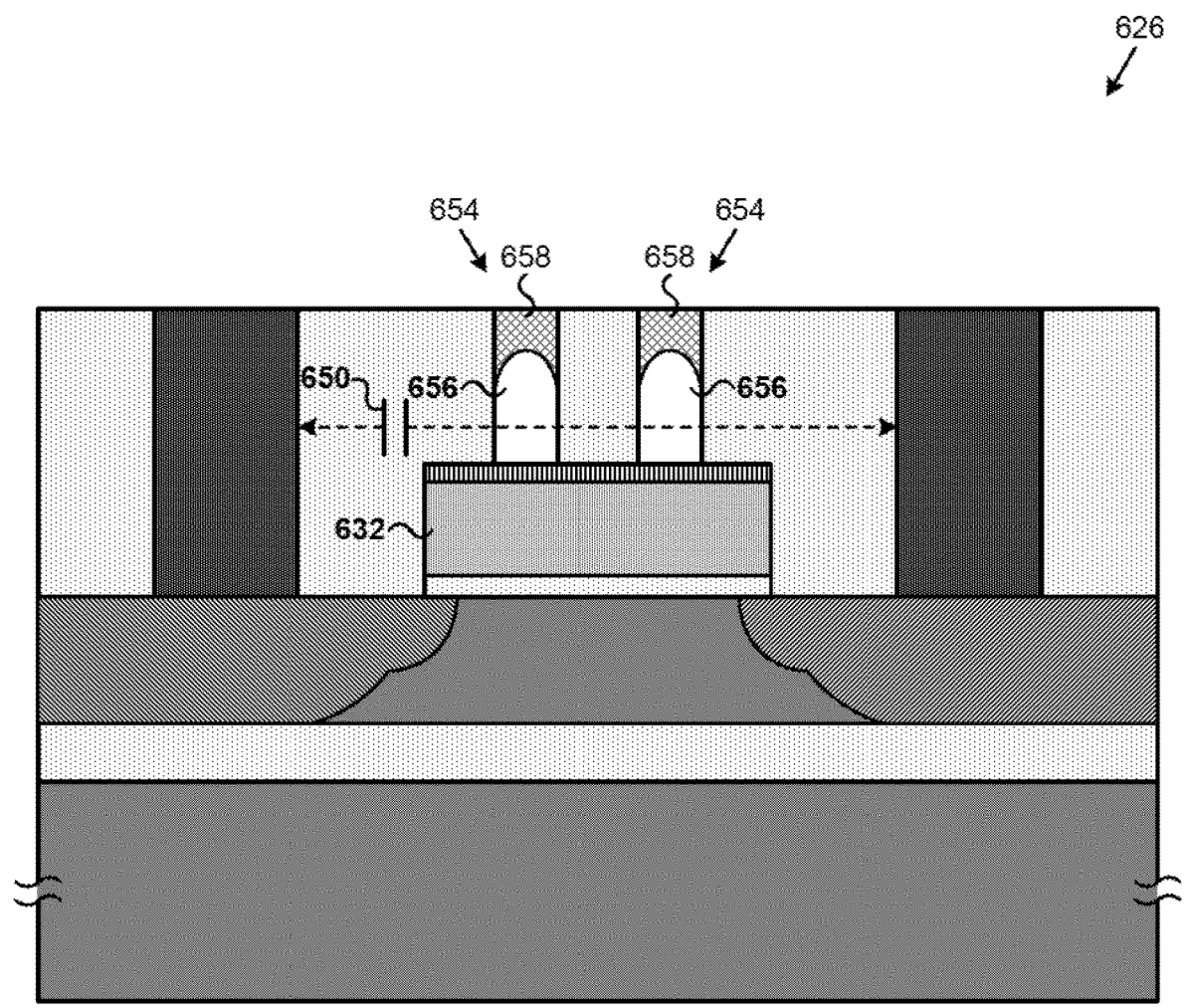
FIG. 6B illustrates a cross-sectional view of a portion of an RF transistor in FIG. 6A according to one implementation of the present application.

FIG. 6B illustrates a cross-sectional view of a portion of an RF transistor in FIG. 6A according to one implementation of the present application. FIG. 6B shows a portion of a cross-section along line 6B-6B in FIG. 6A. RF transistor 626 in FIG. 6B is similar to RF transistor 426 in FIG. 4B, except that RF transistor 626 in FIG. 6B includes two long gaps 654 above gate 632. Long gaps 654 include long air gaps 656 and long pinched-off regions 658. In various implementations, more long gaps 654 than shown in FIG. 6B can be situated over gate 632. In FIG. 6B, long gaps 654 create a larger volume of low dielectric constant material compared to the volume created by gap 454 in FIG. 4B. Thus, the value of OFF-state capacitor 650 in FIG. 6B can be significantly less compared to the value of OFF-state capacitor 450 in FIG. 4B. Other than the differences described above, RF transistor 626 in FIG. 6B may have any implementations and advantages described above.

Figure 7:
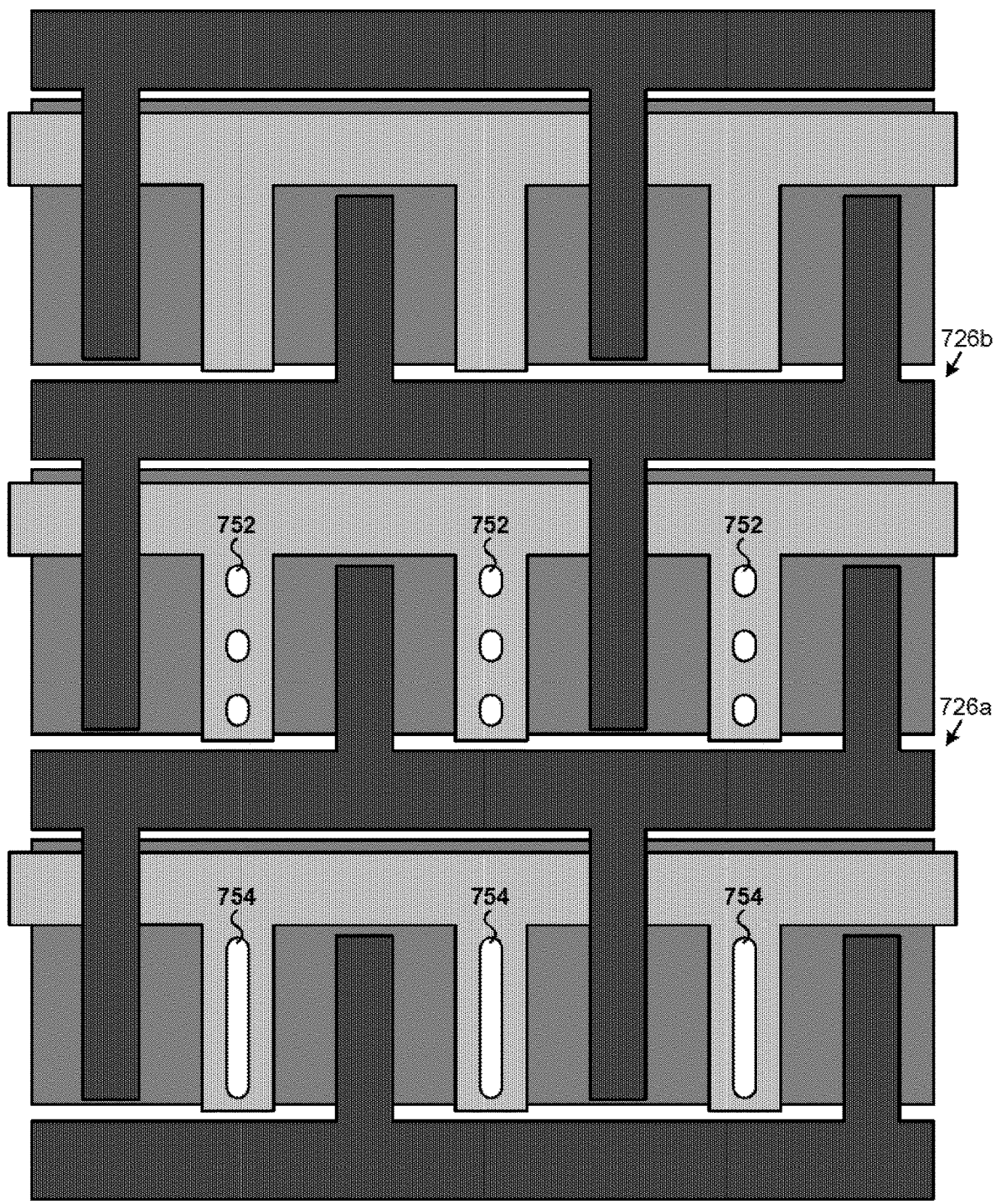
FIG. 7 illustrates a top view of a portion of a stack of RF transistors according to one implementation of the present application.

FIG. 7 illustrates a top view of a portion of a stack of RF transistors according to one implementation of the present application. The stack in FIG. 7 is similar to the stack in FIG. 4A, except that, unlike gaps 452 and 454 in FIG. 4A which are both substantially circular, in FIG. 7, gaps 752 are substantially circular while gaps 754 are long gaps. Long gaps 754 create larger volumes of low dielectric constant material compared to the volumes created by gaps 752. Thus, lower-$C_{OFF}$ transistor 726a has lower $C_{OFF}$ compared to higher-$C_{OFF}$ transistor 726b. Due to long gaps 754, lower-$C_{OFF}$ transistor 726a achieves a low $C_{OFF}$ without requiring a large number of gaps. Other than the differences described above, the stack in FIG. 7 may have any implementations and advantages described above.

Figure 8:
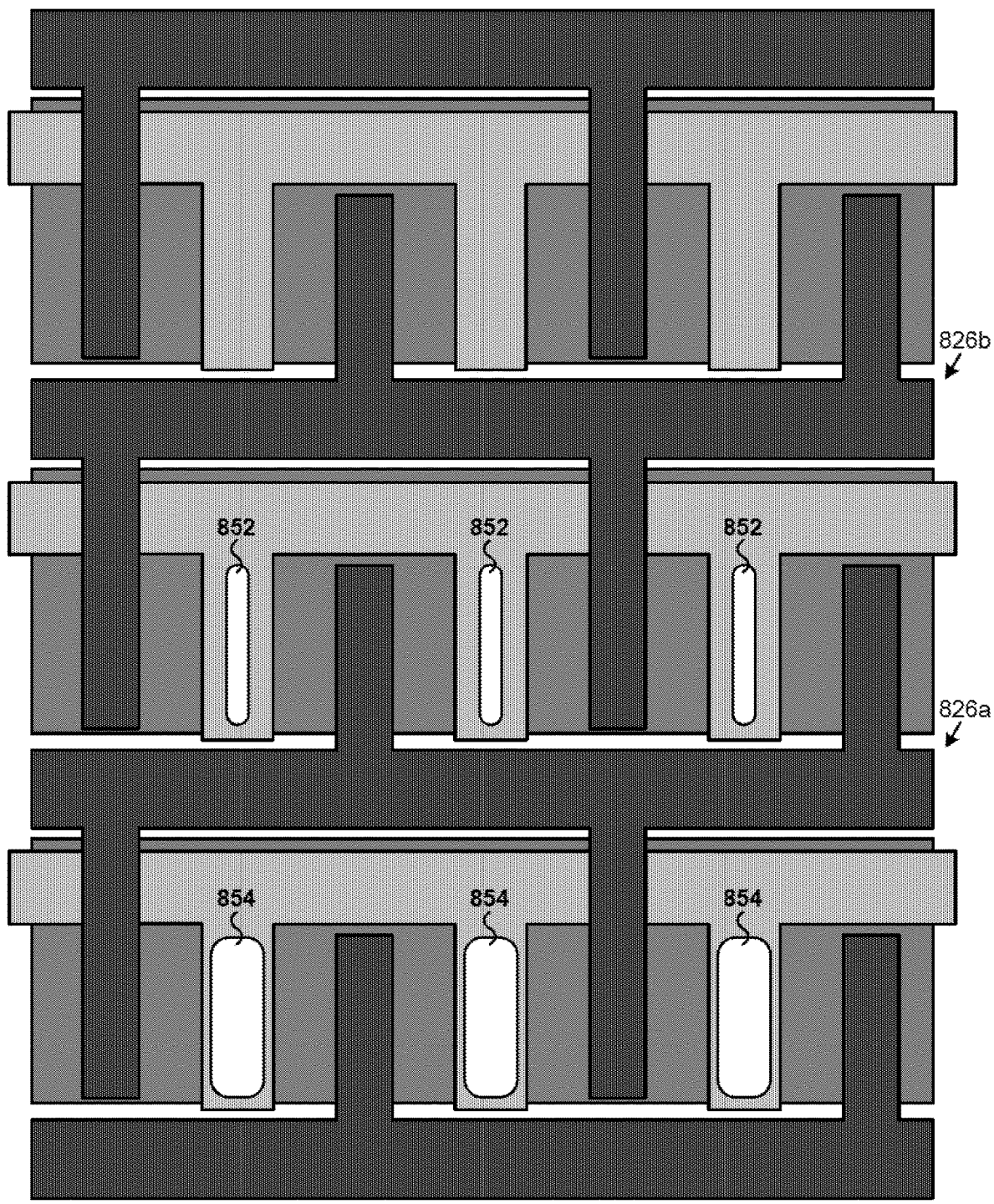
FIG. 8 illustrates a top view of a portion of a stack of RF transistors according to one implementation of the present application.

FIG. 8 illustrates a top view of a portion of a stack of RF transistors according to one implementation of the present application. The stack in FIG. 8 is similar to the stack in FIG. 6A, except that, unlike long gaps 652 and 654 in FIG. 6A which are both long gaps, in FIG. 8, gaps 852 are long gaps while gaps 854 are wide and long gaps. Wide and long gaps 854 create larger volumes of low dielectric constant material compared to the volumes created by long gaps 852. Thus, lower-$C_{OFF}$ transistor 826a has lower $C_{OFF}$, compared to higher-$C_{OFF}$ transistor 826b. Due to wide and long gaps 854, lower-$C_{OFF}$ transistor 826a achieves a low $C_{OFF}$ without requiring a large number of gaps. Wide and long gaps 854 are particularly useful where process restrictions do not significantly limit the dimensions of a gap (e.g., where a gap-fill process can pinch-off an air gap with a large aperture). Other than the differences described above, the stack in FIG. 8 may have any implementations and advantages described above.

Figure 9:
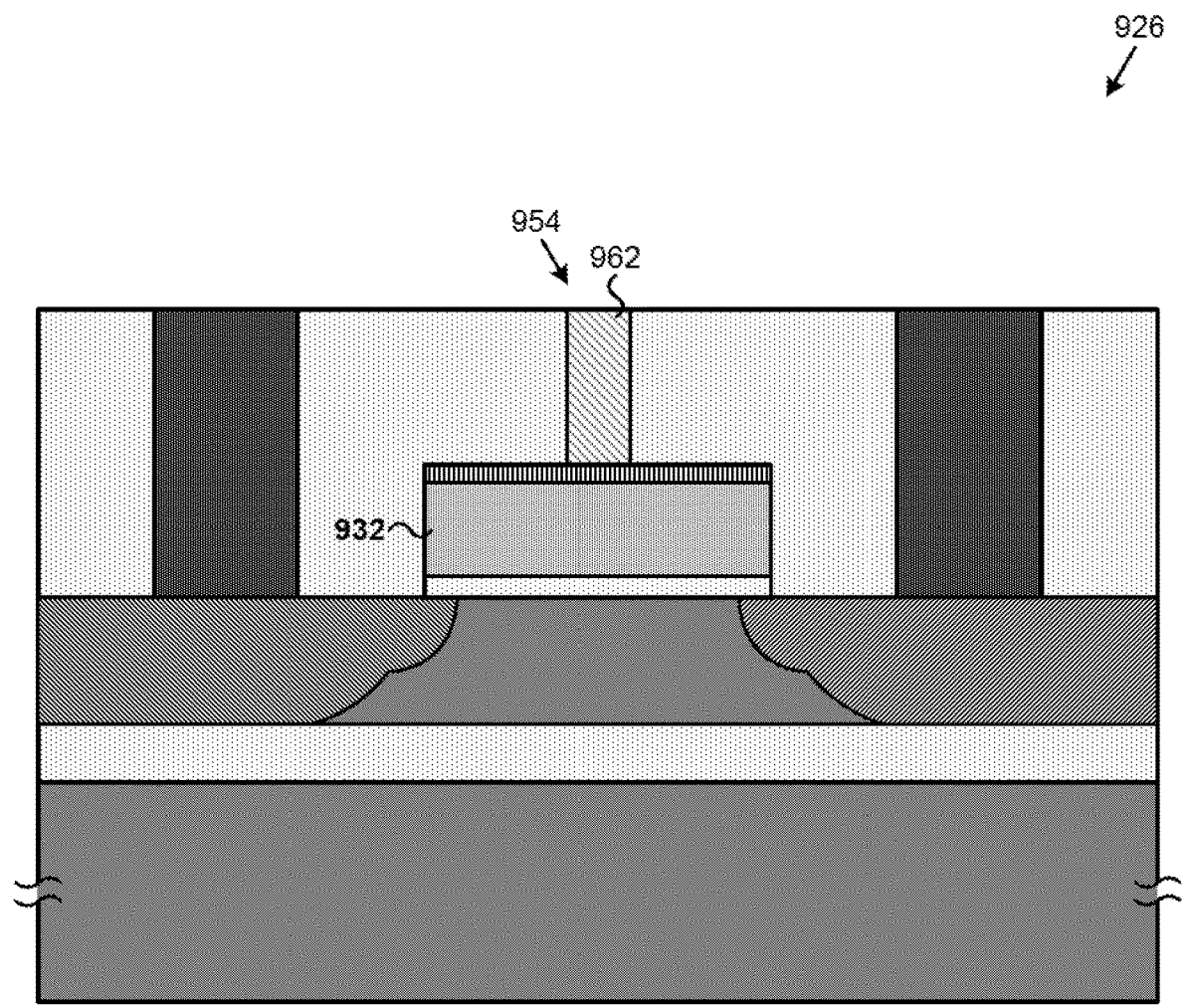
FIG. 9 illustrates a cross-sectional view of a portion of an RF transistor according to one implementation of the present application.

FIG. 9 illustrates a cross-sectional view of a portion of an RF transistor according to one implementation of the present application. RF transistor 926 in FIG. 9 is similar to RF transistor 426 in FIG. 4B, except that RF transistor 926 in FIG. 9 includes low-k dielectric 962 in gap 954 over gate 932. Low-k dielectric 962 is a low dielectric constant material other than air. In various implementations, low-k dielectric 962 comprises carbon-doped silicon oxide, porous silicon oxide, porous carbon-doped silicon oxide, fluorinated amorphous carbon, aromatic hydrocarbon, parylene, silsesquioxane, or fluorinated silicon dioxide. In various implementations, low-k dielectric 962 has a dielectric constant from approximately 2.0 to approximately 3.0. In one implementation, low-k dielectric 962 can be used in addition to an air gap. In one implementation, multiple and different low-k dielectrics can be situated in gap 954. Other than the differences described above, RF transistor 926 in FIG. 9 may have any implementations and advantages described above.

Thus, various implementations of the present application achieve reduced $C_{OFF}$ utilizing the RF transistor of the present application and novel combinations to overcome the deficiencies in the art, and to provide uniform RF voltage distribution in an RF transistor stack and to reduce capacitive loading. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) transistor comprising:
   a drain, a source, and a gate;
   a first dielectric over said source and said drain, said first dielectric having a first dielectric constant;
   a gap in said first dielectric and over said gate, said gap extending to said gate;
   a second dielectric situated in said gap, said second dielectric having a second dielectric constant less than said first dielectric constant so as to reduce an OFF-state capacitance ($C_{OFF}$) of said RF transistor.

2. The RF transistor of claim 1, further comprising a nitride layer over said gate, and wherein said gap extends to said nitride layer.

3. The RF transistor of claim 1, wherein said RF transistor is part of an RF switch situated between an antenna and a low-noise amplifier (LNA).

4. The RF transistor of claim 1, wherein said RF transistor is part of an RF switch situated between a power amplifier (PA) and an antenna.

5. The RF transistor of claim 1, wherein said second dielectric comprises an air gap.

6. The RF transistor of claim 1, further comprising a pinched-off region in said gap.

7. The RF transistor of claim 1, wherein said second dielectric comprises a low-k dielectric.

8. A radio frequency (RF) switch comprising:
   a stack of RF transistors, at least one of said RF transistors comprising:
      a drain, a source, and a gate;
      a first dielectric over said source and said drain, said first dielectric having a first dielectric constant;
      a gap in said first dielectric and over said gate, said gap extending to said gate;
      a second dielectric situated in said gap, said second dielectric having a second dielectric constant less than said first dielectric constant so as to reduce an OFF-state capacitance ($C_{OFF}$) of said at least one of said RF transistors.

9. The RF switch of claim 8, further comprising a nitride layer over said gate, and wherein said gap extends to said nitride layer.

10. The RF switch of claim 8, wherein said RF switch is situated between an antenna and a low-noise amplifier (LNA).

11. The RF switch of claim 8, wherein said RF switch is situated between a power amplifier (PA) and an antenna.

12. The RF switch of claim 8, wherein said second dielectric comprises an air gap.

13. The RF switch of claim 8, wherein said second dielectric comprises a low-k dielectric.

14. A radio frequency (RF) switch comprising:
   a stack of RF transistors including a lower-OFF-state capacitance ($C_{OFF}$) transistor and a higher-OFF-state capacitance ($C_{OFF}$) transistor;
   said lower-OFF-state capacitance ($C_{OFF}$) transistor having a large volume of low dielectric constant material in a large gap over a gate of said lower-OFF-state capacitance ($C_{OFF}$) transistor;
   said higher-OFF-state capacitance ($C_{OFF}$) transistor having a small volume of low dielectric constant material in a small gap over a gate of said higher-OFF-state capacitance ($C_{OFF}$) transistor.

15. The RF switch of claim 14, wherein said RF switch is situated between an antenna and an amplifier, and wherein said higher-OFF-state capacitance ($C_{OFF}$) transistor is situated near said antenna in said stack, and said lower-OFF-state capacitance ($C_{OFF}$) transistor is situated far from said antenna in said stack.

16. The RF switch of claim 14, wherein said RF switch is situated between an antenna and an amplifier, and wherein said higher-OFF-state capacitance ($C_{OFF}$) transistor is situated near said antenna or said amplifier in said stack, and said lower-OFF-state capacitance ($C_{OFF}$) transistor is situated approximately in a middle of said stack.

17. The RF switch of claim 14, wherein said higher-OFF-state capacitance ($C_{OFF}$) transistor has a greater drain-to-source breakdown voltage than said lower-OFF-state capacitance ($C_{OFF}$) transistor.

18. The RF switch of claim 14, wherein said large gap is implemented as a first plurality of gaps and said small gap is implemented as a second plurality of gaps, wherein said first plurality is greater than said second plurality.

19. The RF switch of claim 18, wherein said first plurality of gaps are wide gaps in said lower-OFF-state capacitance ($C_{OFF}$) transistor, and said second plurality of gaps are wide gaps in said higher-OFF-state capacitance ($C_{OFF}$) transistor.

20. The RF switch of claim 18, wherein said first plurality of gaps are long gaps in said lower-OFF-state capacitance ($C_{OFF}$) transistor, and said second plurality of gaps are long gaps in said higher-OFF-state capacitance ($C_{OFF}$) transistor.

* * * * *